Nov. 12, 1968 W. L. JONES 3,410,714

METALLIZING AND BONDING NON-METALLIC BODIES

Filed Oct. 18, 1965

INVENTOR.
WILLIAM L. JONES
BY Henry T. Olsen

United States Patent Office 3,410,714

Patented Nov. 12, 1968

3,410,714

METALLIZING AND BONDING NON-METALLIC BODIES

William L. Jones, Owensboro, Ky., assignor to General Electric Company, a corporation of New York Filed Oct. 18, 1965, Ser. No. 496,755
8 Claims. (Cl. 117—46)

Figure 1:
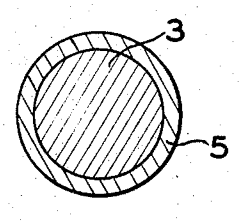

The present invention relates to an improved method of and composition for metallizing non-metallic refractory bodies and more particularly to an improved method of bonding such bodies either together or to a metal.

One of the most useful methods and compositions presently available for bonding non-metallic refractory bodies to themselves or to a metal is known as the active alloy bonding technique, which is disclosed and claimed in U.S. Patent 2,857,663, Beggs, and assigned to the same assignee as herein. In the active alloy technique an active metal such as titanium, zirconium, hafnium, thorium, and alloys of more than one metal of said group, is alloyed with a solder or brazing metal such as copper, nickel, iron, molybdenum, chromium, platinum and cobalt on the ceramic part to be metallized or interposed between the ceramic body and the metal part to be joined. When the associated parts are heated to an elevated temperature, that is to the eutectic temperature of the active alloy, the active metal and the solder metal alloy together and to the refractory material forming a secure bond thereto. It is an object of this invention to provide an improved composition and method for bonding non-metallic refractory members using the active alloy technique.

While satisfactory bonds can be obtained from the aforementioned method, there are certain problems attendant to the use of this technique. For example, in making an electron discharge device, if the amounts of metals are not closely controlled the liquid portion of the material may flow into the interior of the tube and onto the parts thereof rendering them inoperative. Also, when the active metal or the solder metal is to be a structural part of the finished device extreme care must be taken to control the amount of that part which goes into the alloy solution so that the part is not distorted out of its purposeful shape.

It is therefore an object of this invention to provide a method and an improved composition whereby the placement of the active alloy bond and the parts to be joined thereto may be accurately and readily controlled.

It is a further object of this invention to provide an improved form of the active alloy materials whereby the composition is closely and positively controlled.

It is a further object of this invention to provide a method whereby uniform metallizing or bonding between parts may be obtained by a paint or coating technique.

In accordance with one aspect of the invention there is provided a wire or rod having an active metal core clad with the solder metal. As shall be pointed out hereinafter the relative proportions of the metals must be accurately controlled so as to provide an amount of active metal slightly in excess of the lowest melting eutectic alloy proportions. In accordance with another aspect of the invention the active alloy materials are provided in powdered form wherein the individual particles have an active metal core and a cladding of the solder metal in suitable proportions as hereinbefore pointed out. It is therefore an object of this invention to provide a new and useful material for use in the practice of the active alloy technique.

In accordance with a still further aspect of the invention it has been found that the metallizing of non-metallic refractory members can be confined to particular areas by the provision of a carbon or carbon residue material in the areas desired to be metallized. It is therefore a further object of this invention to provide a composition and method utilizing carbon or carbon residue materials for metallizing or bonding non-metallic refractory members.

In a practice of the aforementioned technique of Patent 2,857,663 care must be taken to prevent oxidation of the parts which will disrupt the alloy process. Also, the powdered metals are so reactive that special vacuum processing is required. It is an object of this invention to provide a composition and method wherein the requirement of high vacuum processing is much less stringent.

Thus, in accordance with the above-mentioned objects of the invention there is provided a composite structure in wire or rod or powder form in which the active metal is coated or clad with the solder or brazing metal. The aforementioned composite wire, rod or powder may be deposited on the ceramic body or interposed between ceramic and metal parts and heated in a vacuum to metallize the part or bond the parts together. Since a composite structure is provided the metal part, if such is to be joined to the ceramic, does not enter into the alloying except as incidentally required to form a tight bond. Thus the metal part remains undeformed, while a good bond is still obtained. The composite material is preferably preliminarily bonded to one or both of the parts utilizing a carbon residue obtained during processing from a material such as a nitrocellulose solution in amyl acetate. Thus, on heating, a certain amount of the carbon residue remains on the parts and, as shall be pointed out more particularly hereinafter, this enhances the wetting action and controls the deposition of the active alloy to the desired area.

Figure 2:
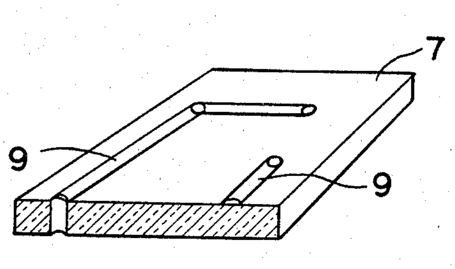

Further objects and advantages of this invention will be found in the following complete description and in the accompanying drawings wherein FIGURE 1 is a sectional view of the material to be used in practicing this invention. FIGURE 2 is a perspective view of a ceramic body metallized in accordance with the inventions.

Referring to the drawing, the material to be used in the practice of this invention is illustrated in cross section wherein a core 3 of active metal is clad or coated with a layer 5 of the solder or brazing metal. It should be understood that the relative proportions shown in the drawing are merely diagrammatic and the amounts to be used should be in accordance with the principles hereinafter set forth. The cross section shown is applicable to a rod or wire material or to fine powders which may be incorporated with a suitable vehicle to provide a flowable suspension application. The metallizing suspension can be applied by painting, spraying, silk screening, flow coating, dipping and similar methods. The active metal of the core is preferably titanium but may be any metal selected from the active metal group consisting of titanium, hafnium, zirconium, vanadium, tantalum, tungsten, and mixtures and alloys thereof. The layer 5 of the solder or brazing material is preferably nickel but may be any metal selected from the group which includes silver, copper, gold, iron, molybdenum, chromium, platinum, cobalt, tin, and mixtures and alloys thereof.

In FIGURE 2 there is shown a ceramic printed circuit board manufactured in accordance with this invention wherein an insulative, often a non-metallic refractory member 7 forms the main body or board portion of the device. The conductive circuit portions 9 consist essentially of the eutectic alloy of the active metal and the brazing metal and are placed on the ceramic substrate by an improved active alloy process in accordance with the invention. A pattern of organic material, which will decompose when heated in vacuum leaving a carbonaceous residue such as nitrocellulose binder is applied to the ceramic substrate in the printed circuit pattern, then pieces of wire or powder which consist essentially of a core of active metal coated with a brazing metal in approximately eutectic proportions are adhered to the nitrocellulose. The ceramic body with the metal materials adhered thereto is placed in a vacuum oven and elevated to a temperature above the eutectic temperature of particular combination of materials. During this heating process, as the active alloy eutectic forms and bonds to the ceramic, the nitrocellulose carbonizes and forms a thin carbon film on the ceramic in the pattern of the desired circuit. While the exact mechanism by which the nitrocellulose controls the pattern of the eutectic mixture of the active metal and the brazing alloy is not known, it is believed that the resultant residual carbon reacts with a Ti-nickel alloy liquid forming a Ti-Ni-C compound of somewhat greater ductility than the eutectic alloy. The conductive circuit portions 9 are thereby formed in the desired pattern.

The printed circuit pattern may also be produced by utilizing a coated powder as aforementioned and in a sprayable mixture. The substrate may be masked and then sprayed with the composite powder mixture and then similarly elevated in temperature to cause alloying and bonding of the eutectic mixture to the substrate. The metallizing mixture contains sufficient binder which will decompose leaving a carbon residue to control the position of the metallizing material. Alternatively, a mixture containing the active alloy material may be painted, silk screened, dipped, or other convenient method onto the substrate prior to heating.

By way of a specific example, 100 grams of approximately 325 mesh titanium powder coated with nickel was mixed into a lacquer-like solution to form a sprayable mixture. The powder was 85% Ti by weight core and 15% Ni coating thereon. Since the Ti-Ni eutectic composition is approximately 75% Ti and 25% Ni, the powder in this case contains an excess of Ti relative to the eutectic proportion. It will be recognized that the Ti-Ni alloy system, as shown in Hansen's Constitution of Binary Alloys, 2nd ed., 1958, pp. 1050 and 1051, shows three eutectic points and the eutectic proportion referred to herein is the lowest melting eutectic. The vehicle in which the powder is mixed comprises 250 ml. of solvents, that is, 95 ml. of toluene and 155 ml. of amyl acetate, 5 gm. of iso-butyl-methacrylate binder and 0.35 gm. nitrocellulose binder, the latter material will decompose leaving a carbon residue upon heating in vacuum, the other compounds will volatize. A forsterite substrate was suitably masked to provide the desired circuit pattern and then sprayed with the aforementioned material. Upon placement in a vacuum oven and heated, the hydrocarbons for the most part are vaporized with some carbon residue remaining in situ from the nitrocellulose. When the liquidus temperature of the Ti-Ni eutectic is reached, this alloy flows and adheres to the substrate forming the conductive strips of the circuit board.

The above titanium powder coated with nickel was obtained by sizing titanium powder through a 325 mesh screen. The 325 mesh material, approximately 44 microns maximum size, was then coated, as by a fluidized bed process, with approximately a 6 micron thickness of nickel forming particles having a maximum size of about 50 microns. For spray coating purposes it is preferred that the particle size be kept in the 10–50 micron range.

Thus, it will be seen that there is provided an improved method for metallizing ceramics using active alloys and that the materials and methods enhance the flow of the alloys onto the ceramic by the use of carbon residue material. The use of a composite material comprising an active metal coated with the brazing material reduces the need for vacuum technique since the active metal is not exposed to oxidation and closely controls the actual alloying because the composite material contains the proper ratio of active metal to brazing metal for best results.

While the invention has been specifically disclosed with respect to the production of a circuit board, it will be appreciated that it is equally applicable to the metallizing of ceramics generally and to bonding ceramics together or to suitable metal parts. Therefore, it is intended that while the invention has been illustrated and described in its presently preferred form the invention shall be only limited to the spirit and scope thereof as set forth in the appended claims.

What is claimed as new and desired to be secured by Letters Patent of the United States is:

1. A method of metallizing non-metallic refractory materials comprising the steps of applying to said non-metallic refractory material composite metal particles consisting essentially of an active metal selected from the group consisting of titanium, hafnium, thorium, zirconium, vanadium, tantalum, tungsten, and mixtures and alloys thereof, coated with a brazing metal selected from the group consisting of silver, copper, gold, nickel, iron, molybdenum, chromium, platinum, cobalt, tin, and mixtures and alloys thereof, and heating said material to a temperature above the lowest eutectic melting temperature of the active alloy in a non-reactive atmosphere to effect bonding of the metal to the refractory.

2. A method of metallizing non-metallic refractory materials comprising the steps of applying to said non-metallic refractory material composite metal particles consisting essentially of predetermined proportion of active metal selected from the group consisting of titanium, hafnium, zirconium, thorium, vanadium, tantalum, tungsten, and mixtures and alloys thereof, coated with a predetermined proportion of brazing metal selected from the group consisting of silver, copper, gold, nickel, iron, molybdenum, chromium, platinum, cobalt, tin, and mixtures and alloys thereof, the proportion of the active metal relative to the brazing metal being at least equal or greater than the lowest melting eutectic proportion, and heating said material to a temperature above the lowest eutectic melting temperature of the active alloy in a non-reactive atmosphere to effect bonding of the metal to the refractory.

3. A method of metallizing non-metallic refractory materials comprising the steps of applying to said non-metallic refractory material composite metal particles consisting essentially of titanium coated with nickel, and heating said material to a temperature above the lowest eutectic melting temperature of the active alloy in a non-reactive atmosphere to effect bonding of the metal to the refractory.

4. A method of metallizing non-metallic refractory materials comprising the steps of applying to said non-metallic refractory material a composite metal consisting essentially of a predetermined proportion of an active metal selected from the group consisting of titanium, hafnium, zirconium, thorium, vanadium, tantalum, tungsten, and mixtures and alloys thereof, coated with a predetermined proportion of a brazing metal selected from the group consisting of silver, copper, gold, nickel, iron, molybdenum, chromium, platinum, cobalt, tin, and mixtures and alloys thereof, the proportion of active metal relative to the brazing metal being at least equal to or greater than the lowest melting eutectic proportion, and heating said material to a temperature above the lowest eutectic temperaure of the active alloy in a non-reactive atmosphere to effect bonding of the metal to the refractory.

5. A method of metallizing non-metallic refractory materials comprising the steps of applying to said non-metallic refractory material suspension comprising composite metal particles consisting essentially of an active metal selected from the group consisting of titanium, hafnium, thorium, zirconium, vanadium, tantalum, tungsten, and mixtures and alloys thereof, coated with a brazing metal selected from the group consisting of silver, copper, gold, nickel, iron, molybdenum, chromium, platinum, cobalt, tin, and mixtures and alloys thereof, organic binder material including at least a small but significant amount of organic material which reduces to carbon upon heating and sufficient volatile organic solvent to render the coating material paintable, and heating said material to a temperature above the lowest eutectic melting temperature of the active alloy in a non-reactive atmosphere to effect bonding of the metal to the refractory.

6. A method of metallizing non-metallic refractory materials comprising the steps of applying to said non-metallic refractory material a coating material comprising composite metal particles consisting essentially of predetermined proportion of active metal selected from the group consisting of titanium, hafnium, thorium, zirconium, vanadium, tantalum, tungsten, and mixtures and alloys thereof, coated with a predetermined proportion of brazing metal selected from the group consisting of silver, copper, gold, nickel, iron, molybdenum, chromium, platinum, cobalt, tin, and mixtures and alloys thereof, the proportion of the active metal relative to the brazing metal being greater than a eutectic proportion, organic binder material including at least a small but significant amount of organic material which reduces to carbon upon heating and sufficient volatile organic solvent to render the coating material paintable, and heating said material to a temperature above the lowest eutectic melting temperature of the active alloy in a non-reactive atmosphere to effect bonding of the metal to the refractory.

7. A method of metallizing non-metallic refractory materials comprising the steps of applying to said non-metallic refractory material a paintable coating material composite metal particles consisting essentially of titanium coated with nickel, organic binder material including at least a small but significant amount of organic material which reduces to carbon upon heating and sufficient volatile organic solvent to render the coating material paintable, and heating said material to a temperature above the eutectic temperature of the active alloy in a non-reactive atmosphere to effect bonding of the metal to the refractory.

8. A method of metallizing non-metallic refractory materials comprising the steps of applying to said non-metallic refractory material an organic binder which reduces to carbon upon heating and a composite metal consisting essentially of a predetermined proportion of an active metal selected from the group consisting of titanium, hafnium, thorium, zirconium, vanadium, tantalum, tungsten, and mixtures and alloys thereof, coated with a predetermined proportion of a brazing metal selected from the group consisting of silver, copper, gold, nickel, iron, molybdenum, chromium, platinum, cobalt, tin, and mixtures and alloys thereof, the proportion of active metal relative to the brazing metal being greater than a eutectic proportion, and heating said material to a temperature above the eutectic temperature of the active alloy in a non-reactive atmosphere to effect bonding of the metal to the refractory.

References Cited

UNITED STATES PATENTS

| | | | |
|---|---|---|---|
| 2,689,294 | 9/1954 | Weber et al. | 117—124 XR |
| 2,857,663 | 10/1958 | Beggs | 29—494 XR |
| 3,254,970 | 6/1966 | Dittrich et al. | 117—105.2 |
| 3,338,688 | 8/1967 | Longo | 117—105.2 |

ALFRED L. LEAVITT, *Primary Examiner.*

W. F. CYRON, *Assistant Examiner.*